(12) United States Patent
Gundry et al.

(10) Patent No.: US 7,551,745 B2
(45) Date of Patent: Jun. 23, 2009

(54) VOLUME AND COMPRESSION CONTROL IN MOVIE THEATERS

(75) Inventors: Kenneth James Gundry, San Francisco, CA (US); John Iles, San Francisco, CA (US); Roger Wallace Dressler, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 833 days.

(21) Appl. No.: 10/423,487

(22) Filed: Apr. 24, 2003

(65) Prior Publication Data

US 2004/0213420 A1    Oct. 28, 2004

(51) Int. Cl.
*H04B 3/00* (2006.01)
*H03G 3/00* (2006.01)

(52) U.S. Cl. .................. 381/106; 381/80; 381/104; 381/109

(58) Field of Classification Search ................ 381/102, 381/104, 106–109, 80; 352/27, 37
See application file for complete search history.

(56) References Cited

U.S. PATENT DOCUMENTS

| | | | |
|---|---|---|---|
| 2,019,615 A | 11/1935 | Maxfield | 179/1 |
| 3,772,479 A | 11/1973 | Hilbert | |
| 3,987,402 A | 10/1976 | Smith | |
| 4,024,344 A | 5/1977 | Dolby et al. | |
| 4,061,874 A | 12/1977 | Fricke et al. | 179/1 |
| 4,577,305 A | 3/1986 | Allen et al. | |
| 5,113,447 A | 5/1992 | Hatley et al. | |
| 5,138,665 A | 8/1992 | Ito | 381/104 |
| 5,200,708 A | 4/1993 | Morris, Jr. et al. | |
| 5,305,388 A | 4/1994 | Konno | 381/102 |
| 5,530,760 A | 6/1996 | Paisley | 381/27 |
| 5,617,158 A * | 4/1997 | Miyamori et al. | 352/37 |
| 6,148,085 A | 11/2000 | Jung | 381/104 |
| 6,278,751 B1 * | 8/2001 | Uramoto | 375/345 |
| 6,311,155 B1 | 10/2001 | Vaudrey et al. | 704/225 |
| 6,351,733 B1 | 2/2002 | Saunders et al. | 704/500 |
| 6,442,278 B1 | 8/2002 | Vaudrey et al. | 381/27 |
| 6,498,855 B1 | 12/2002 | Kokkosoulis et al. | 381/106 |
| 6,650,755 B2 | 11/2003 | Vaudrey et al. | |

(Continued)

FOREIGN PATENT DOCUMENTS

DE    198 18 217    10/1999

(Continued)

OTHER PUBLICATIONS

Bauer, Benjamin B., et al., "The Measurement of Loudness Level," Journal of the Accoustical Society of America, Aug. 1971, pp. 405-414.

(Continued)

*Primary Examiner*—Vivian Chin
*Assistant Examiner*—Douglas J Suthers
(74) *Attorney, Agent, or Firm*—Thomas A. Gallagher

(57) ABSTRACT

A single control determines both volume and the degree of compression in the reproduction of motion picture soundtracks. For some settings of the control, compression or limiting reduces the highest levels on a movie soundtrack, leaving the dialogue level substantially unchanged, thus removing the reason for complaints from the audience without the danger of making the dialogue too quiet for intelligibility.

27 Claims, 5 Drawing Sheets

U.S. PATENT DOCUMENTS

| | | |
|---|---|---|
| 2002/0013698 A1 | 1/2002 | Vaudrey et al. ............. 704/225 |
| 2002/0040295 A1 | 4/2002 | Saunders et al. ............ 704/200 |
| 2002/0076072 A1* | 6/2002 | Cornelisse ................. 381/312 |
| 2003/0002683 A1 | 1/2003 | Vaudrey et al. ............... 381/27 |
| 2004/0008851 A1 | 1/2004 | Hagiwara |

FOREIGN PATENT DOCUMENTS

| | | |
|---|---|---|
| EP | 1 253 805 | 10/2002 |
| GB | 1 328 141 | 8/1973 |
| GB | 2 031 638 | 4/1980 |
| JP | 2907847 | 7/1990 |
| WO | WO 99/26455 | 5/1999 |

OTHER PUBLICATIONS

Ioan Allen "Are Movies Too Loud?," SMPTE Film Conference, Mar. 22, 1997.

Dolby Laboratories, Inc., "Dolby Model 737 Soundtrack Loudness Meter" brochure, Copyright 1998.

Dolby Laboratories, Inc., "Dolby Model 737 Soundtrack Loudness Meter—Leq(m) Users' Manual Issue 3, Part No. 91533," Copyright 2000.

Press Release—Dolby Laboratories, Inc., "Dolby Announces New effort to Banish TV Volume Problems at AES-2002," 112$^{th}$ AES Convention in Munich, May 10-13, 2002.

Dolby Laboratories, Inc., "LM 100 Broadcast Loudness Meter Preliminary Information" brochure, Copyright 2002.

Dolby Laboratories, Inc., "LM 100 Broadcast Loudness Meter," Copyright 2002.

Dolby Laboratories, Inc., "Preliminary Specification LM100 Broadcast Loudness Meter," Copyright 2002.

Dolby Laboratories, Inc., "Dolby Model 737 Soundtrack Loudness Meter," Copyright 2002.

Dolby Laboratories, Inc., "Dolby Model DP564 Multichannel Audio Decoder Users' Manual Issue 1, Part No. 91830," Copyright 2002.

Notification of the First Office Action (PCT Application in the National Phase), The Patent Office of the People's Republic of China, Application No. 200480010077.1, dated Aug. 8, 2008.

* cited by examiner

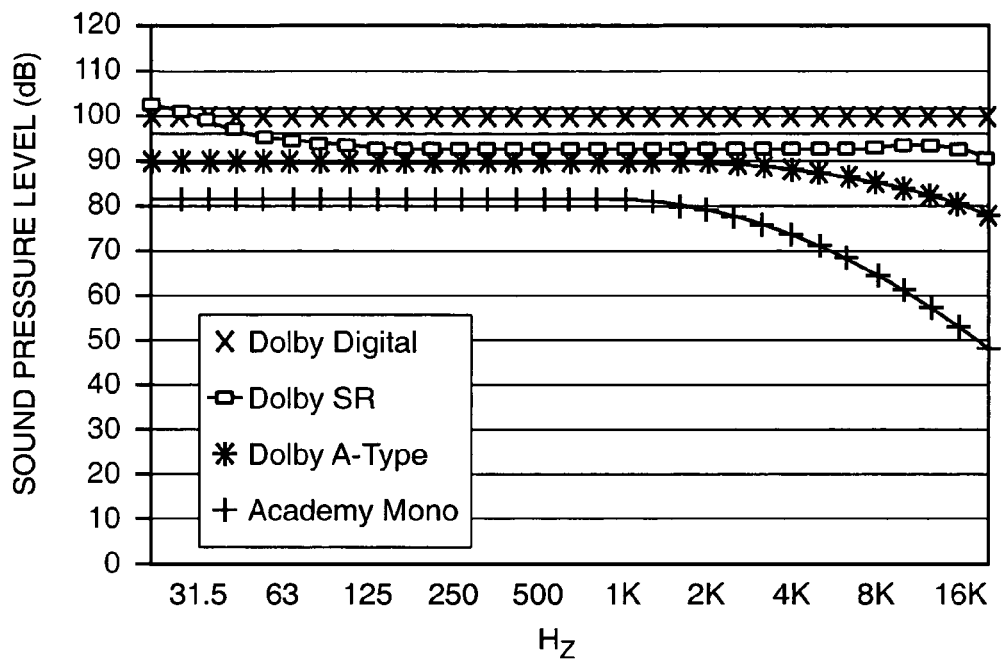
FIG._1
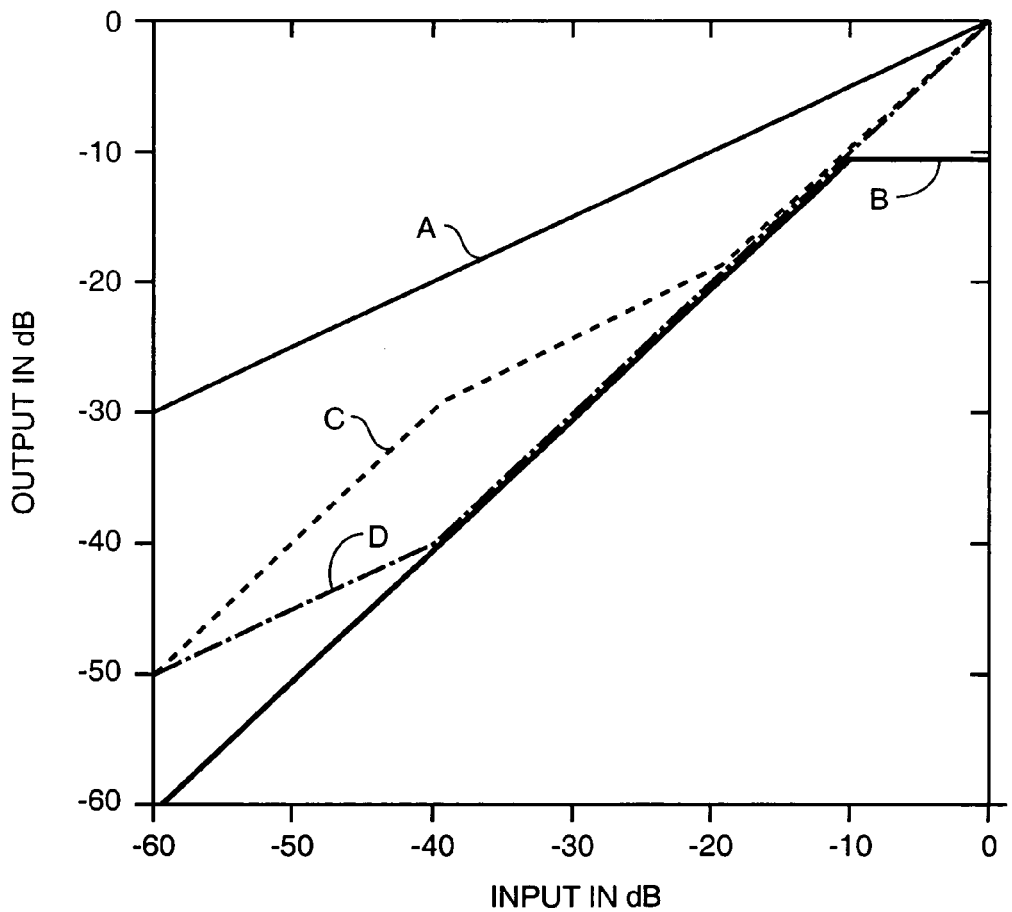
FIG._2

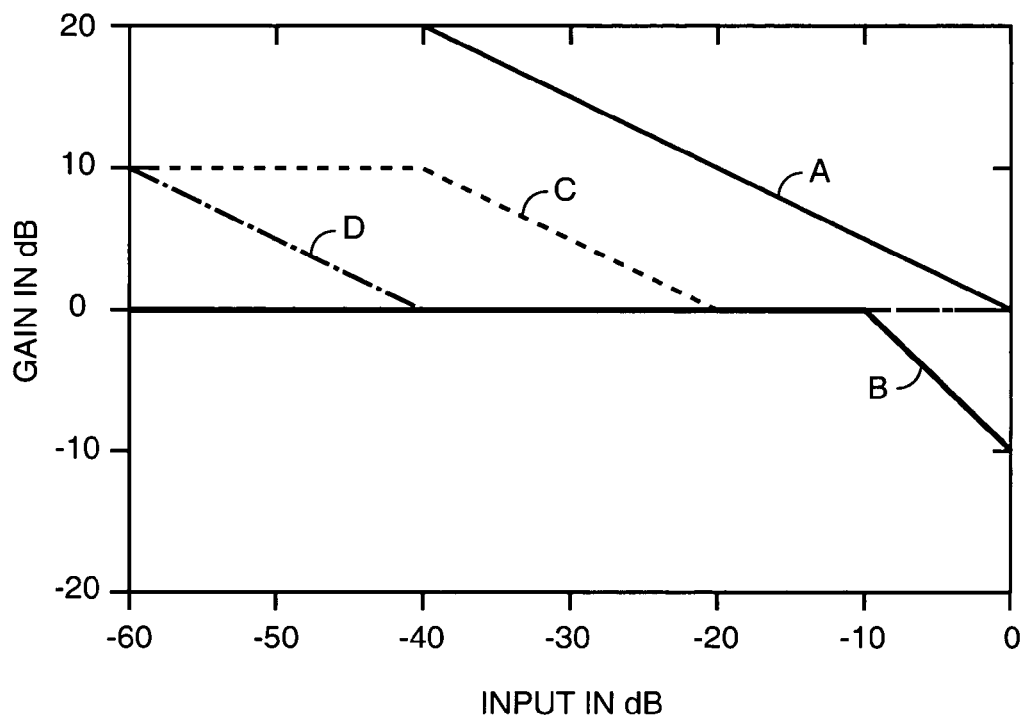
FIG._3
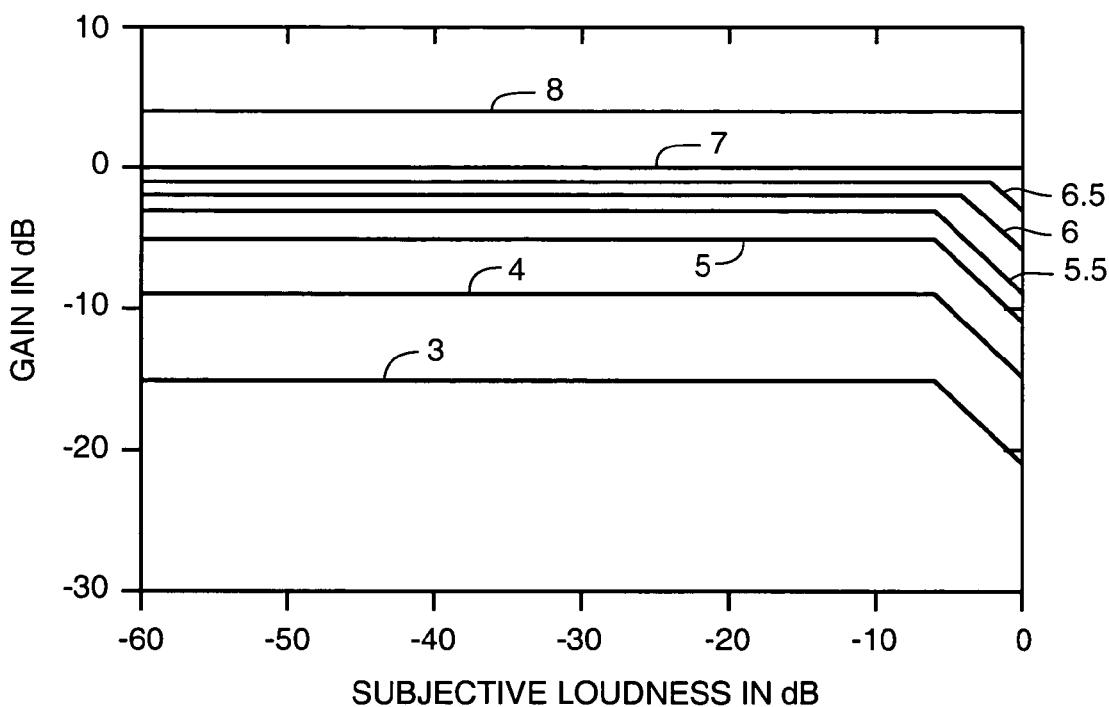
FIG._4

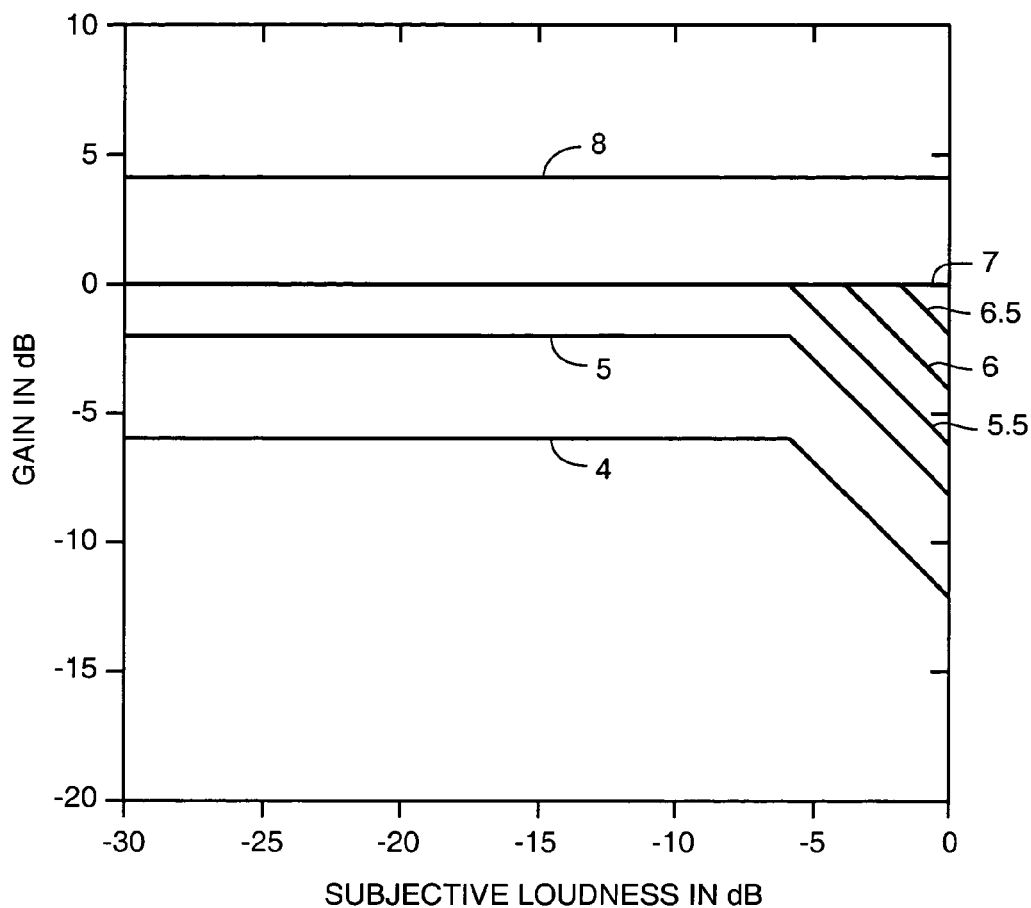
FIG._5
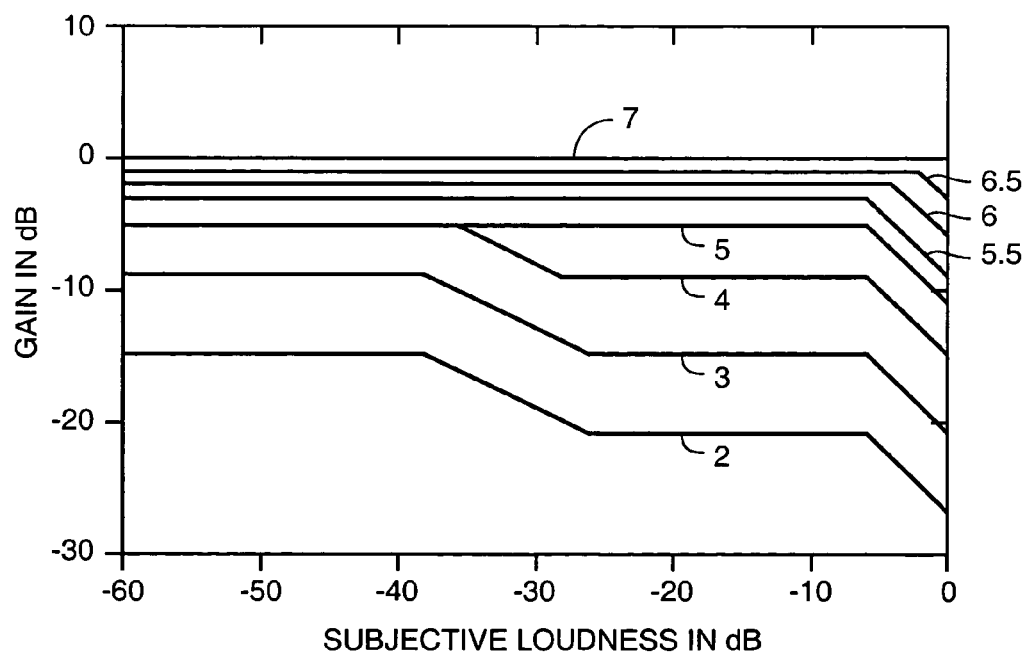
FIG._6

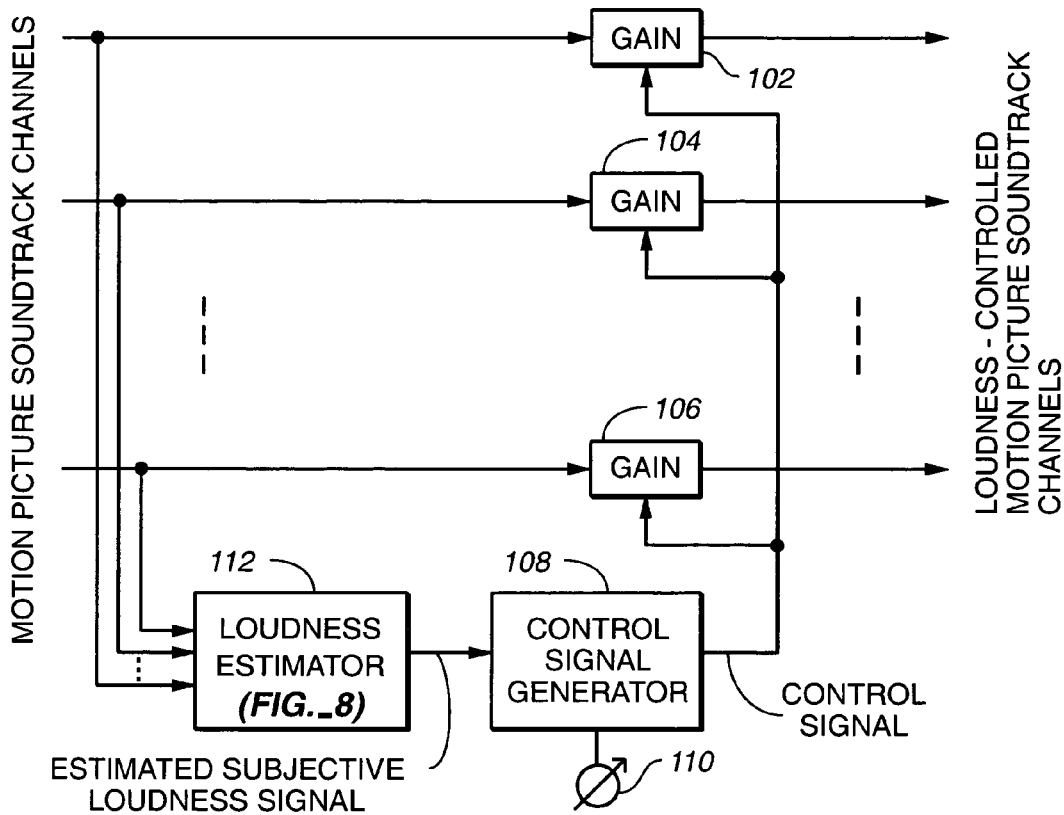
FIG._7
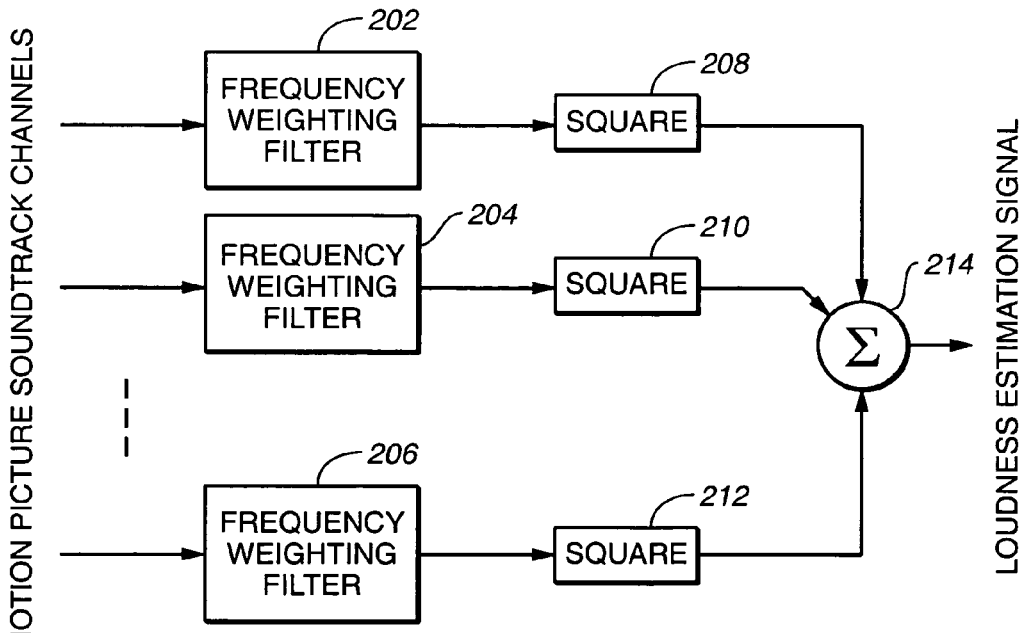
FIG._8

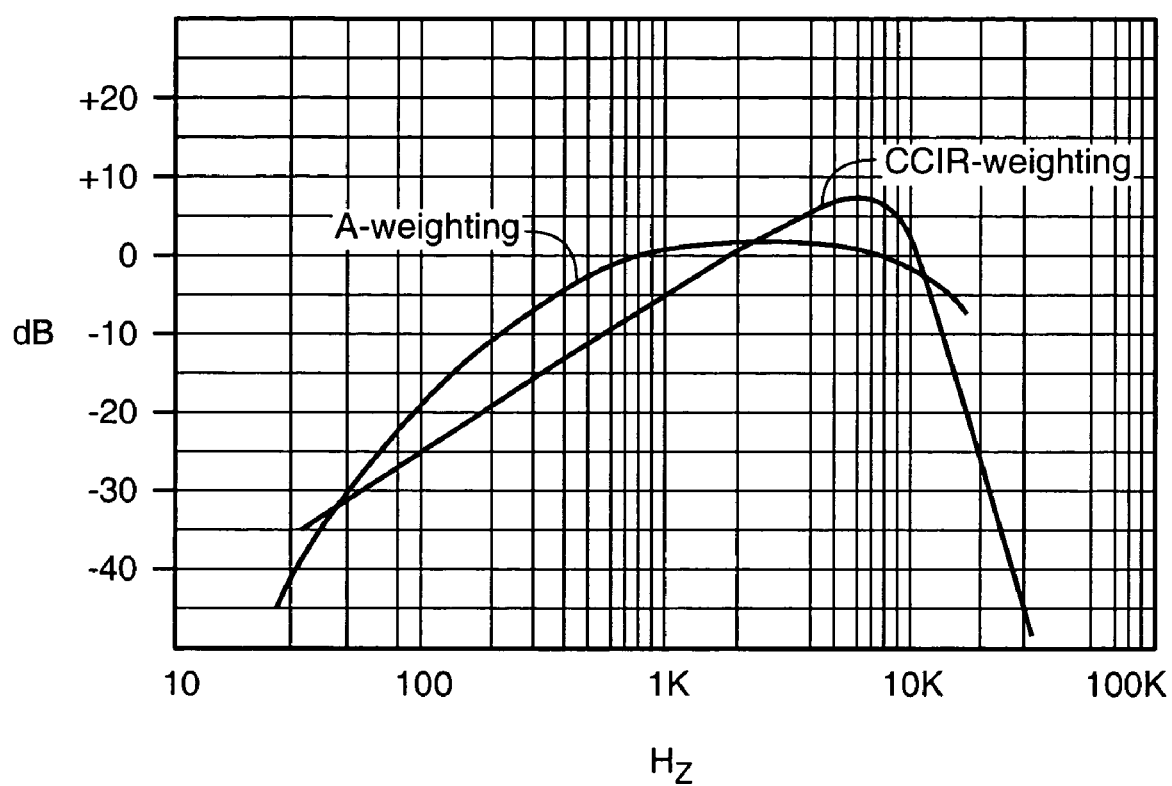
FIG._9

VOLUME AND COMPRESSION CONTROL IN MOVIE THEATERS

TECHNICAL FIELD

The invention relates generally to the processing of audio signals. More particularly, the invention relates to control of the loudness of motion picture soundtracks when reproduced.

BACKGROUND ART

In the mid-1970s, Dolby Laboratories introduced a calibration recommendation for monitor levels in movie soundtracks ("Dolby" is a trademark of Dolby Laboratories, Inc.). A pink noise reference signal was used in the record chain to adjust the audio monitor level to 85 dBc. All theatres equipped for playback of the new stereo optical soundtracks were set up such that an equivalent pink noise signal in a soundtrack channel generated the same 85 dBc with the playback volume control (fader) set to the calibrated setting. This meant that theatres playing films at the calibrated volume control setting (a setting of "7" in a range of "0" to "10" on most cinema processors) reproduced the same loudness level selected by the film director and audio engineers in the dubbing theatre (referred to herein as "the mixer").

This system worked quite well for many years. Dolby Stereo (A-type encoded) films had limited headroom and the resulting constrained dynamic range yielded few audience complaints. Most theatres played films at the calibrated level. Soundtrack format technology has been significantly enhanced since Dolby Stereo. Dolby SR extended the headroom by 3 dB at midrange frequencies, and more at low and high frequencies. In recent years, the new digital formats have further increased the headroom. FIG. 1 shows maximum sound pressure level of one reproduced soundtrack channel versus frequency for four photographic soundtrack formats, Academy mono, Dolby A-type, Dolby SR and Dolby Digital. The curves are normalized with respect to their reference levels. Thus, they show the maximum sound pressure level that one channel of each different optical soundtrack system is capable of when playing a motion picture at the calibrated volume control setting in a properly set up theater. The maximum sound pressure level in a theater is also a function of the number of soundtrack channels. For example, five channels can deliver 2.5 times as much power as two channels, resulting in an increase of 4 dB in sound pressure level. Thus, in the case of five or seven channel digital soundtrack reproduction, for example, the increase in peak sound pressure level is even greater than that shown in FIG. 1.

Because the 85 dBc calibration technique has been maintained throughout evolving format changes, additional headroom is available on the newer soundtracks. However, feature films do have a consistent, subjective mix reference, independent of increased headroom, for dialogue record level, known as "associative loudness." When the dubbing mixer sees an actor on the screen, and there is no conflict between the dialogue and music or effects, the dialogue level in a moderate close-up is set to be plausible for the visual impression. Within reasonable limits, this generally holds true to within 2 or 3 dB. This natural dialogue level does not hold true for narration, as there is no corresponding visual reference. Music and effects have no direct visual associative loudness. Most people are not familiar with the actual sound pressure levels of a Concorde takeoff or a 50 mm howitzer. The music score level is equally uncalibrated.

As the headroom capability of the recording medium has been extended, it has certainly been used: the "non-associative" loudness of effects and music has risen to fill the available headroom space. Using dialogue as a reference, loud sounds like explosions are often 20 dB or more louder (explosions reach full scale peak level of 25 dB above dialogue level), and some quiet sounds, which are intended to be heard by all listeners, such as leaves rustling, may be 50 dB quieter.

In response to audience complaints that movies are too loud, many theatres are playing films substantially below the calibrated level. A volume control setting (fader level) of "6" or "5½," as opposed to the calibrated level (volume control standard setting) of "7," is not uncommon, representing a loudness reduction of approximately 4 or 6 dB. Some cinemas have their volume control permanently turned down to such settings because projectionists operating multiplexes with many screens showing different movies simultaneously don't have the time or cannot be bothered to set the controls differently for different movies. If the volume control is turned down to avoid complaints of excessive loudness, the dialogue is quieter than the mixer intended, and audiences may complain instead that some dialogue is not intelligible in the presence of other sounds in the film and/or general background noise of the theater (popcorn eating, air-conditioning, people talking, etc.). Theatre playback levels are often set by complaints generated by the loudest (and earliest) element of the show. If the playback level is set in response to the loudest trailer (preview), which is often louder than the feature film, the feature often plays at the same reduced level. The result is that the dialogue level of the feature is lowered by the same level deemed necessary to attenuate the trailer. A feature film played with a loudness 6 dB below the calibrated level may have serious dialogue intelligibility problems and very quiet sounds may become inaudible.

In addition, it is possible that the increased use of headroom from Dolby A-type to Dolby SR and digital releases has not been matched by a corresponding increase in power amplifier and loudspeaker capability. The resultant distortion from overloaded equipment may well exacerbate the loudness problems of recent soundtracks, causing increased incidence of complaints.

In early cinema sound equipment employing calibration, the volume control was a mechanical potentiometer, often with a click-stop or detent at the standard setting. More recent (digital) equipment uses a shaft encoder or a pair of up-down buttons (with a numeric display for the setting), delivering a control signal that operates on multipliers (either digital or voltage-controlled amplifiers) to affect the gain applied to all channels of the reproduced soundtracks. In typical cinema sound equipment, the volume control varies the gain gradually and relatively uniformly over a range of settings from about "4" to "10," with the gain falling more rapidly at setting below about "4," allowing a fade to inaudibility.

DISCLOSURE OF INVENTION

The present invention provides a motion picture soundtrack reproduction system, the system having a plurality of soundtrack channels. An estimator of the loudness of the channels when reproduced provides a loudness estimation level in response to the soundtrack channels or data associated with the soundtrack channels. A control for adjusting both gain and compression applied to the channels has a range of settings from a minimum to a maximum including a standard setting at which a signal having a respective reference level in each channel is reproduced at a respective standard acoustic level. At the standard setting, the gain applied to each of the channels is substantially constant for all loudness estimation levels and substantially no compression is applied.

For each control setting in a range of control settings less than the standard setting, the gain of each channel is substantially constant at each control setting and substantially no compression is applied for loudness estimation levels up to a threshold higher than the standard acoustic level and, for loudness estimation levels above the threshold, compression is applied to one or more channels, the threshold decreasing as the control setting decreases.

The range of control settings less than the standard setting extends down to the minimum control setting, or, alternatively, the range of control settings less than the standard setting extends down to a further setting above the minimum control setting.

For control settings in the range of control settings less than the standard setting extending down to the further setting, the gain of each channel may remain substantially constant as the control setting decreases.

For control settings in a range of control settings below about the further setting, the gains of all the channels may decrease as the control setting decreases.

For control settings in a range of control settings below about the further setting, the threshold may remain substantially constant.

For control settings in the range of control settings less than the standard setting extending down to the further setting, the gain of each channel may decrease as the setting decreases at a rate less than the decrease in gain as the control setting decreases for settings below about the further setting.

For control setting at and above about the standard setting, substantially no compression may be applied and the gain of the channels may increase as the control setting increases.

As noted above, the standard acoustic level provides a standard acoustic level for dialogue. Consequently, the threshold may be above a loudness estimation level that results in the compression of dialogue, so that dialogue is not compressed.

When compression is applied, it may be applied to all channels or only to some channels and not to all channels. When applied to all channels, it may be applied uniformly or non-uniformly. When applied only to some channels and not to all channels, it may be applied uniformly or non-uniformly to channels to which it is applied.

As one alternative, when the plurality of soundtrack channels includes a plurality of front soundtrack channels and a plurality of surround soundtrack channels, less compression may be applied to the surround soundtrack channels than to the front soundtrack channels.

The compression applied to one or more channels may have a linear limiting characteristic.

For a further range of control settings below the further setting, for loudness estimation levels lower than a low-level threshold, compression may be applied to the one or more channels.

The loudness estimated by the estimator may be an estimation of the subjective loudness of the channels that would result if the control were set at its standard setting.

The loudness estimated by the estimator may be a measure of subjective loudness of the plurality of soundtracks as a function of an estimated acoustic level of some or all the reproduced channels, their frequency content, and time.

The estimator may provide a loudness estimation level in response to soundtrack channel signal voltage levels.

The estimator may provide a loudness estimation level in response to a summation of the frequency-weighted and squared soundtrack channel signal voltage levels for all soundtrack channels. The frequency weighting may be A-weighting, CCIR-weighting (also known as ITU/R weighting), or some other suitable weighting.

The estimator may provide a loudness estimation level in response to metadata associated with the soundtrack channels.

Thus, the invention provides for a single control to determine both volume and the degree of compression in the reproduction of motion picture soundtracks. For some settings of the control, compression or limiting reduces the highest levels on a movie soundtrack, leaving the dialogue level substantially unchanged, thus removing the reason for complaints from the audience without the danger of making the dialogue too quiet for intelligibility.

In other words, the compressor threshold is a function of the setting of the "volume control." At a standard setting and above, the compressor is disabled (it is of no significance whether it is actually disabled or whether the threshold is raised so far that signals cannot reach it). Over a limited range of settings below the standard setting, the control reduces the overall gain by less than would normally be expected of a conventional volume control (or by nothing at all), but the compressor threshold is placed within the possible range of estimated loudness levels so that the compressor will operate if and when the estimated loudness is sufficient to reach that threshold. Turning the control down moves the threshold down, affecting lesser levels of estimated loudness. After the control has been turned down to the point where the highest possible say 6 or 8 dB of loudness has been limited, the compression characteristic may be maintained substantially fixed and further reduction in the control setting introduces conventional volume reduction. For each setting of the "volume control" there is one and one only threshold value.

For example, when the cinema volume control is at a standard setting (e.g., "7" on many type of current equipment and "0.0" on certain others), the compressor is inactive. If the control is turned down to say "6," which would in normal cinema equipment lower the volume of all channels in the soundtrack by 3 or 4 dB, instead low to middle level signals including typical dialogue are affected little or not at all, but the highest levels, the loudest in the possible loudness range, are attenuated by compression or limiting action in response to a measure of subjective loudness. In other words, turning the volume control down from its standard setting to a somewhat lower setting serves to moderate the loudest sounds but leaves dialogue and quieter sounds at the levels intended by the mixer. As the volume control is turned down further, the compression threshold is lowered, resulting in high-level compression over a wider range of loudness levels. Optionally, at some yet lower setting, the compression reaches a maximum degree of effectiveness (the compression threshold does not lower further), and further adjustment of the control setting attenuates the (compressed) signal in the same manner as a normal volume control.

As a further option, as the control is turned down from its standard setting to the setting where low and mid-level signals are reduced in level, low-level signals may be subject to compression (boost), in order to maintain their level so that they are not overcome by background noise of the cinema. This option may be implemented so that below yet a further setting, low-level compression reaches a maximum degree, and further lowering of the control setting decreases gain in the channels, allowing the sound to be faded to inaudibility.

An aspect of the present invention is that it is an estimation of the level of the reproduced loudness exceeding a threshold that leads to compression. The estimation is derived from signal levels in some or all of the soundtrack channels, applying appropriate time constants, as is discussed further below.

"Level" and "threshold" parameters have been measured and defined in many ways. For instance, in broadcast limiters intended to prevent overmodulation of transmitters, the "level" is generally the peak of the waveform (often the greatest of as many channels as there are), or perhaps a smoothing of the peak over a few hundreds of microseconds or a few milliseconds. For a studio compressor, the level is quite commonly the power measured over a few tens of milliseconds (sometimes described loosely as rms), or perhaps the mean amplitude measured over the same period. For the automatic gain control in a consumer video camera/recorder, it is frequently the amplitude measured via a non-linear filter with an "attack time" of a few milliseconds and a "recovery time" of tens of seconds. In broadcast and studio devices, there is often some provision, such as band-splitting or frequency weighting, or both, to reduce the undesirable effect whereby some parts of the spectrum modulate the gain in other parts. Whatever measure of the signal is used to control compression, the threshold is in the same "units."

In accordance with the present invention, the measure used to control the compressor may consist of an estimate of subjective loudness or annoyance. Various techniques for estimating subjective loudness may be employed, as are described further below.

BRIEF DESCRIPTION OF DRAWINGS

FIG. 1 shows maximum sound pressure level versus frequency for four photographic soundtrack formats, Academy mono, Dolby A-type, Dolby SR and Dolby Digital.

FIG. 2 is an idealized set of the loudness output versus audio input relationships of several compressors.

FIG. 3 is an idealized set of the gain (vertical axis) versus audio input (horizontal axis) relationships of several compressors. FIG. 3 conveys the same information as that of FIG. 2 but does so in a different format with the vertical scale representing gain rather than output loudness.

FIG. 4 is an idealized set of the gain applied to the reproduced sound (vertical axis) versus the subjective loudness (horizontal axis) (more precisely, an estimate of the subjective loudness with respect to the loudest sounds the motion picture soundtrack reproduction system is capable of reproducing with no compression and the volume control at the standard setting) for an embodiment of the invention.

FIG. 5 is an idealized set of the gain applied to the reproduced sound (vertical axis) versus the subjective loudness (horizontal axis) (more precisely, an estimate of the subjective loudness with respect to the loudest sounds the motion picture soundtrack reproduction system is capable of reproducing with no compression and the volume control at the standard setting) for an alternative embodiment of the invention.

FIG. 6 is an idealized set of the gain applied to the reproduced sound (vertical axis) versus the subjective loudness (horizontal axis) (more precisely, an estimate of the subjective loudness with respect to the loudest sounds the motion picture soundtrack reproduction system is capable of reproducing with no compression and the volume control at the standard setting) for a further alternative embodiment of the invention.

FIG. 7 is a simplified functional block diagram showing an arrangement for controlling the gain or loss applied to audio signals in response to a control signal derived from a loudness estimation of the audio signals and a control setting.

FIG. 8 is a simplified functional block diagram showing the generation of an estimate of loudness in response to multiple channels of audio.

FIG. 9 show an A-weighting curve with respect to a CCIR-weighting curve (also known as an ITU-R weighting curve).

BEST MODE FOR CARRYING OUT THE INVENTION

The implementation of the present invention may be viewed as involving an audio compressor in which the compressor has a family of input/output response characteristics that are selected by the setting of a single control, conventionally a "volume" control, but in the context of the invention a control that selects not only a volume characteristic, but for some control settings, a compression response for very loud reproduced audio and, optionally, for both very loud and very quiet reproduced audio.

The design of dynamic range compressors and linear limiters is well established, and details of the dynamic behavior (attack time, recovery time, hold time, program-adapting time-constants, etc.) of a compressor for applications of the present invention are not the subject of this patent. Similarly, compressors may operate on the whole signal or on portions of the audio bandwidth, using band splitting. One skilled in the art will be able to design those aspects of a suitable compressor. Hence this description will concentrate on the "law" of the compressor, that is, the relationship between output level and input level, or equivalently, between gain and the estimated loudness that controls the compressor.

In order to better understand the invention, a brief review of audio compressor action is useful. FIG. 2 is an idealized set of the loudness output versus audio input relationships of several compressors. For each, the axes represent levels on decibel scales, with 0 dB being arbitrary but frequently representing the highest achievable level without overload. A portion of a characteristic where the slope of the line is unity (i.e., at 45 degrees) represents a constant gain or loss (i.e., no change in dynamics). If this portion, or its projection, passes through 0 dB on both axes, it represents unity gain (unity gain is provided in a motion picture sound system when the volume control setting is at its standard setting). Any line at 45 degrees lower represents a (fixed) loss, on higher up, a (fixed) gain or boost. Thus, a conventional volume control could be portrayed as a family of lines at 45 degrees, one for each setting. A portion of a characteristic where the slope is shallower than unity represents signal-dependent varying gain providing compression (reduction in dynamic changes). For completeness, but not significant for this invention, a portion of a characteristic with a slope greater than unity represents expansion (increase in dynamic changes).

Curve A shows a compression characteristic with a constant slope over the whole range of audio input levels; in this example, a 1 dB change in input results in a 0.5 dB change in the output.

Curve B shows what is generally known as a limiter (a compressor with an infinite compression ratio, sometimes referred to as a linear limiter to emphasize that there is no clipping involved); in this example, up to a predetermined input threshold, the output is exactly equal to the input, but once that threshold is exceeded, the limiter introduces loss equal to the degree by which the input has gone over the threshold, with the result that the output level remains at and does not rise significantly above the threshold value.

Although the concept of a linear limiter is well known, the term usually refers to a device controlled by the peak of the audio waveform. Its usual function is to avoid overload by preventing the peaks from exceeding a well-defined maximum (for instance, 100% modulation of an AM transmitter, digital full-scale in an analog to digital converter or the maximum legal modulation of an FM transmitter). A best mode of the present invention uses a compression characteristic that looks like a conventional linear limiter, but differs in that the parameter being measured is estimated loudness, not peaks.

Curve C shows a more complicated compression characteristic, similar to that employed in Dolby noise reduction systems and known as a bilinear characteristic, in which there are two thresholds, known as the start and the finish points. Below the start point, the gain is constant (say 10 dB) so the output follows the input but is consistently 10 dB larger. Above the finish point, the gain is constant but less than 10 dB; in this example, it is 0 dB, so the output is equal to the input. Between the start and finish points, the slope is less than one, representing dynamic compression.

Curve D shows a compressor that affects low-level signals only. Above a −40 dB threshold the gain is constant, but below it, positive level-dependent gain boosts the quiet signals.

FIG. 3 is also an idealized set of the gain versus audio input relationships of several compressors. FIG. 3 conveys the same information as that of FIG. 2 with respect to the same examples but does so in a different format with the vertical scale representing gain rather than output loudness. Although the FIG. 3 format is uncommon, it is believed to indicate more clearly the compressor action and is used in FIGS. 4-6 that illustrate exemplary aspects of the present invention.

Returning to the description of FIG. 3, in all cases, the axes represent levels on decibel scales, with 0 dB on the horizontal axis being arbitrary but frequently representing the highest achievable level without overload. A portion of a characteristic where slope of the line is zero (i.e. horizontal) represents a constant gain or loss (i.e. no change in dynamics). If this portion, or its projection, passes through 0 dB on the vertical axis, it represents unity gain. If it is lower, it is a loss, if higher, a boost. A portion of a characteristic where the slope is negative represents signal-dependent varying gain providing compression (reduction in dynamic changes). For completeness, but not significant for this invention, a portion of a characteristic with a positive slope represents expansion (increase in dynamic changes).

Curve A shows a constant slope compressor, where over the whole range of input levels, a 1 dB increase in input results in a 0.5 dB decrease in gain and hence an increase in the output of only 0.5 dB.

Curve B shows what is generally known as a limiter (sometimes, linear limiter to emphasize that there is no clipping involved); in this example, up to a predetermined input threshold, the gain is 0 dB so the output is exactly equal to the input, but once that threshold is exceeded, the limiter introduces attenuation equal to the degree by which the input has gone over the threshold, as shown explicitly in FIG. 3, with the result that the output level remains at and does not rise significantly above the threshold value.

Curve C shows a more complicated compression characteristic, similar to that employed in Dolby noise reduction systems and known as a bilinear characteristic, in which there are two thresholds, known as the start and the finish points. Below the start point, the gain is constant (say 10 dB) so the output follows the input but is consistently 10 dB larger. Above the finish point, the gain is constant but less than 10 dB; in this example, it is 0 dB, so the output is equal to the input. Between the start and finish points, the slope is negative, representing dynamic compression, and FIG. 3 a shows how the gain falls with increasing input level.

Curve D shows a compressor that affects low-level signals only. Above a −40 dB threshold the gain is constant at 0 dB, but below the threshold, positive level-dependent gain boosts the quiet signals."

FIG. 4 shows the gain applied to the reproduced sound versus the subjective loudness (more precisely, an estimate of the subjective loudness with respect to the loudest sounds the motion picture soundtrack reproduction system is capable of reproducing with no compression and the volume control at the standard setting) for various control settings, in accordance with an embodiment of the present invention. As can be observed, the gain characteristics for certain control settings provide high-level compression/limiting. For settings of "7," the standard setting, and above, there is no compression and the overall gain varies conventionally with the control setting. For settings between "7," the standard setting, and about "5.5," for example, the gain over most of the dynamic ranges varies more slowly than for a conventional volume control (e.g., 2 dB per "setting unit" instead of approximately 4 dB per setting unit in this part of the range in standard motion picture sound systems), but high-level limiting attenuates the loudest sounds more for such control settings, with a threshold that moves down with decreasing control settings. Below settings of about "5.5," the threshold ceases to move and overall attenuation of the (limited) signal occurs.

One useful variation of the characteristics shown in FIG. 4 is shown in FIG. 5, wherein for settings between "7," the standard setting, and about "5.5," the gain does not vary but the threshold decreases with decreasing control settings.

FIG. 6 shows representative relationships between the gain applied to the reproduced sound and the subjective loudness (more precisely, an estimate of the subjective loudness with respect to the loudest sounds the motion picture soundtrack reproduction system is capable of reproducing with no compression and the volume control at the standard setting) with both high-level limiting and low-level compression. Above a setting of "5," for example, the result is the same as in FIG. 3. For settings between "7" and about "5.5," for example, the gain over most of the range is turned down modestly (e.g., 2 dB per division), but the limiting threshold falls so the loudest sounds are turned down more. Alternatively, the gain may remain constant as in the FIG. 5 alternative. For settings between about "5.5" and about "5," the overall (limited) gain is turned down by 2 dB. For settings between about "5" and about "3," for example, more attenuation is introduced as in FIG. 3, but, in addition, low-level compression results in less attenuation for quiet sounds, with thresholds that change with the control setting. Note that despite the compression, these quiet sounds are never boosted to a higher level than they would have had at the standard setting of "7" (the gain lines never cross). Below a setting of about "3," the overall compressed and limited signal is simply turned down as if by a conventional volume control (i.e., the thresholds do not move further).

The behavior of the FIG. 4-6 characteristic responses can be realized in many ways, but may be most easily achieved using some form of look-up table, where each volume control setting has associated with it an overall gain value, a threshold of limiting and, if low-level compression is used, the start and finish points and the compression ratio between those points. With modern processing techniques, it is easy both in the analog and digital domains to construct compressors with desired compression slopes and desired thresholds for any of these characteristics and for many others, and to vary those parameters in predetermined ways. While the characteristic responses shown in the examples of FIGS. 4-6 are practical and useful ones, the precise characteristics are not critical. The characteristics shown in the figures are just one example of suitable characteristics that fall within the scope of the invention.

For example, there is no need to ensure that because the limiting threshold is, say, 4 dB below maximum loudness at a control setting of "6," that that threshold moves linearly with control settings between "6" and "7" and becomes precisely 0 dB, maximum possible loudness, at "7." In actual installations, the maximum possible loudness of a system is typically not well defined, depending among other things on the relative powers of the amplifiers, the sensitivities of the loudspeakers, their overload levels and the frequency dependence of these parameters. Practical embodiments need not take all such parameters into account with any rigor. A rough estimate of maximum possible loudness in an installation might be made at the time of installation time in accordance with the equipment in use and the size of the room. If the equipment is underpowered, it might be desirable to enable the compression more abruptly as the control setting is turned down from its standard setting. Thus, the extent to which the threshold moves into the active range for a particular control setting below "7" might not be the same from installation to installation. For example, the characteristic curves resulting from the control settings labeled "4" to "6.5" in FIG. 4 might actually occur instead over the range of settings from "4.5" to "6.9," so that moving the control setting from "6.9" to "7" would have the effect of moving abruptly from something close to the curve labeled "6.5" to that labeled "7" (in the manner of a push-button switch).

FIG. 7 is a simplified functional block diagram showing an arrangement for controlling the gain or loss applied to audio signals in response to a control signal derived from a subjective loudness estimation of the audio signals and a control setting. In principle, any number of multiple motion picture soundtrack channels may have their loudness modified. The figure shows three channels, as an example. The gain applied to each of a plurality of motion picture soundtrack channels is controlled, for example, by a multiplier (or multiplier function) or voltage-controlled amplifier (VCA) 102, 104, 106, responding to a control signal from a control signal generator or generator function 108. The characteristic response of the control signal is selected by the control setting of a single control 110 in the manner of the FIG. 4 through FIG. 6 examples, discussed above. An estimated subjective loudness signal derived by a loudness estimator or loudness estimation function 112, responsive to the motion picture soundtrack channels, or from a data signal associated with the channels, provides the input to the control signal generator or generator function 108 from which the control signal output is generated. Thus, the control for the gain in each channel is derived from two inputs, the "volume control" setting and the estimated loudness. In one embodiment of the invention, except for very loud signals, the gain is determined solely by the control setting. When the signals are very loud, exceeding a threshold that depends on the control setting, the gain is reduced to provide compression, as is explained above.

In the example of FIG. 7, the same gain control signal is applied to all soundtrack channels in response to an estimated loudness signal derived from all of the soundtrack channels. As mentioned above, there are alternatives in which the gain of less than all soundtrack channels is controlled and/or in which the estimated loudness signal is derived from less than all of the soundtrack channels.

When there is more than one channel of audio, it is conventional to control the gains of all channels equally, so avoiding the "wandering" of the apparent positions of sound images, but in a multichannel cinema application there may be advantage in treating front or front and surround channels partially or completely independently of the other channels. Although it is preferred that all channels are controlled in accordance with the same gain/compression characteristic, it may be useful to apply compression to some channels and not to others or to apply lesser degrees of compression to some channels. For example, it may be useful to apply compression to all channels except center front, or to apply lesser degrees of compression to center front, since in conventional soundtracks virtually all the dialogue appears in the center front channel.

There may also be some advantage to applying different gains to front channels with respect to surround channels. The audience is facing the screen, and is most sensitive to frontal direction. Any changes in relative gains applied to the front channels could result in movement of the apparent position or direction of sound sources (a very few dB change can lead to major shifts in position). Similarly, if there is an ambience set up by a number of surround channels, any changes in relative gains might alter the center of gravity of that ambience, so instead of being symmetrical (neither to left nor right), it might acquire a bias to one side. However, it would be an unusual sound that would be falsified by a modest difference in gain between front and surround. As another example, rapidly recovering compression on a reverberant decay apparently extends the reverberation. If the surround channels were principally carrying reverberation, it would be preferable to apply compression to the front channels only, leaving the reverberant decay from the surrounds uncompressed and hence, unextended.

There are many ways in which one might apply different compression to some channels with respect to others. One might derive one control signal, and use it in different proportions on the surround and front channels, so that, for example, when the surround channels are attenuated by, say, 4 dB the front channels are only turned down by 2 dB. Alternatively, one might make separate estimates of the loudness for the front and surround channels The example of FIG. 7 shows the control signal being derived from what may be considered to be the input of a compressor. The loudness estimation can be derived from the input (from the soundtrack channels prior to volume adjustment and/or compression) as shown in FIG. 7, or from the output (from the audio soundtracks after volume adjustment and/or compression) or from an acoustic measurement in the listening area. The first two alternatives require some combination of the channels to assess their total loudness. In the third case, the listening area does the combination so only one microphone would be necessary.

The compression and volume adjustment would interact differently if one derived control from after, rather than before, the VCA or multiplier. For instance as one turned down the control to the point where the actual overall gain was being reduced, the result would be to back away from the compression threshold, so the signal would not remain compressed for low settings. In practice, it is best to avoid recursion, feedback, output control, etc. in digital implementations.

FIG. 8 is a simplified functional block diagram showing the generation of an estimate of loudness in response to multiple channels of audio. The figure shows three channels, as an example. As indicated above, the horizontal axes in FIGS. 4-6 represent acoustic levels if those signals were reproduced without compression and with the volume control at the standard setting. In accordance with the invention, a preferred measure for this purpose is one that correlates with subjective loudness and/or subjective annoyance. In general, this requires measurement of a combination of all channels, such as the sum of their energies, a way of ensuring that the frequency-dependence of subjective loudness and/or annoyance is taken into account (by weighting or, alternatively, by employing multiband methods), and a way to take into account that loudness depends on the duration of a sound as well as on its sound pressure level (i.e., suitable time-constants). It is believed that a frequency dependence that places a greater emphasis on low treble (e.g., an approximate range of 2 to 6 kHz) would tend to take annoyance into consideration.

In the FIG. 8 embodiment, the electrical signal in each soundtrack channel is frequency weighted by a frequency weighting function or frequency weighting filter 202, 204, 206, such as an A-weighting or a CCIR-weighting as described in the Dolby Model 737 Soundtrack Loudness Meter—Leq(m) Users Manual and shown here in FIG. 9.

CCIR weighting is also known as ITU/R weighting. Each weighted signal is squared in a squaring function or device 208, 210, 212 to provide an energy measurement of each channel. The weighted energy signals are then additively combined in a summation function or device 214. A summation of the energies of all the channels over a suitable time period, such as few tens or hundreds of milliseconds, delivers a single estimation of loudness waveform that is a function of time.

As might be expected, soundtracks yield different loudness values when assessed with different frequency weightings. For example, the low-frequency roll-off of A-weighting results in a reduction in the loudness estimation level when the material has a substantial bass content. Placing heavier emphasis on the 2 to 6 kHz region may better match how people react to soundtrack loudness. The CCIR-weighting curve (also known as the ITU/R weighting curve), originally intended to measure low-level recording medium noise may more closely match subjective annoyance criteria than does the A-weighting curve.

As mentioned above, subjective loudness is a function not only of acoustic level and frequency content but also of duration. Complaints from the audience are not just because the movie soundtracks are uncomfortably loud but that discomfort is sustained. If a sound has a very high sound pressure but only lasts for a few or a few tens of milliseconds, it does not give the subjective impression of being very loud. There is a finite rate of build-up of the impression of loudness. Thus, it is preferred to apply smoothing over at least tens of milliseconds, so that a brief high-level signal in the soundtracks does not cause the loudness estimation level to exceed a threshold and cause compression. On the other hand, sustained loudness should generate a control signal that exceeds a threshold and causes compression. In a practical system, attack times of a few tens of milliseconds (corresponding roughly to the buildup of subjective loudness) but a recovery rather longer, hundreds of milliseconds or seconds, may be suitable. A loudness estimation control signal derived from very short-term measurements (such as waveform peak) is undesirable.

Alternatively, program responsive time constants may be employed. For example, an isolated loud sound, enough to actuate the compression, may benefit from a fast recovery, so that by the time hearing sensitivity has recovered, gain is back to normal. In contrast, for a series of loud sounds coming in fairly rapid succession, each enough to actuate compression but separated enough that hearing recovers in between, at least partially, it may be desirable to hold the compression between them or to apply a much slower recovery time, reducing the modulation effects that the varying gain might produce.

The need to minimize compression artifacts by optimizing time constants may not be particularly important because the high-level compression aspect of the invention operates only on the loudest few dB of the soundtrack range (when the sounds are so loud that some degradation may be acceptable, or at least preferable to the sounds getting louder still) rather than at dialogue loudness levels.

The control signal generated by an arrangement such as in FIG. 8 is an estimation of loudness because a real loudness measure would require a microphone in the listening area. The FIG. 8 arrangement makes electrical measurements at a point in the chain where signal voltage levels have a known relationship to acoustic sound pressure levels when the soundtracks are reproduced (the relationship is known when the control is at its standard setting).

Alternatively, the estimate of loudness may be provided by metadata associated with the motion picture soundtracks. In other words, the metadata carries the estimate of subjective loudness, avoiding the need to calculate it within the loudness estimator or loudness estimation function 112 (FIG. 7). The metadata may be encoded into one or more of the soundtracks or carried separately but in association with one or more of the soundtracks. By "associated with" is meant that the metadata is related to the soundtrack information and is carried by the motion picture along with the soundtracks whether in a traditional context on a motion picture film strip (or on a disc carrying motion picture soundtracks synchronized to the film) or in a digital cinema context as digital data constituting part of a digital motion picture. By employing metadata, the entire motion picture could be analyzed in advance and suitable control signals generated and recorded on the motion picture. If a sound is in fact very loud, but it only lasts a few seconds or represents a very small part of the duration of a motion picture, the audience is unlikely to object. The best way of dealing with such sounds may be to employ metadata to provide the loudness estimation control signal.

The present invention and its various aspects may be implemented in analog circuitry, or as software functions performed in digital signal processors, programmed general-purpose digital computers, and/or special purpose digital computers, or some combination of such devices and functions. Interfaces between analog and digital signal streams may be performed in appropriate hardware and/or as functions in software and/or firmware.

The invention claimed is:

1. A motion picture soundtrack reproduction apparatus, the apparatus having a plurality of soundtrack channels, comprising an estimator of the loudness of the channels when reproduced, the estimator providing a loudness estimation level in response to the soundtrack channels or data associated with the soundtrack channels, a control for adjusting both gain and compression applied to the channels, the control having a range of settings from a minimum to a maximum including a standard setting at which a signal having a respective reference level in each channel is reproduced at a respective standard acoustic level, wherein at said standard setting, the gain applied to each of the channels is substantially constant for all loudness estimation levels and substantially no compression is applied, and for each control setting in a range of control settings less than said standard setting, for loudness estimation levels below a threshold higher than said standard acoustic level, the gain of each channel is substantially constant at each control setting, the gain staying substantially the same or decreasing as the control setting decreases, and substantially no compression is applied for loudness estimation levels up to said threshold and, for loudness estimation levels above said threshold, compression is applied to one or more channels, the threshold decreasing as the control setting decreases.

2. The apparatus according to claim 1 wherein the range of control settings less than said standard setting extends down to the minimum control setting.

3. The apparatus according to claim 1 wherein the range of control settings less than said standard setting extends down to a further setting above the minimum control setting.

4. The apparatus according to claim 3 wherein, for a further range of control settings below said further setting, for loudness estimation levels lower than a low-level threshold, compression is applied to said one or more channels.

5. The apparatus according to claim 3 wherein for control settings in the range of control settings less than said standard setting extending down to said further setting, the gain of each channel remains substantially constant as the control setting decreases.

6. The apparatus according to claim 3 wherein for control settings in a range of control settings below about said further setting, the gains of all the channels decrease as the control setting decreases.

7. The apparatus according to claim 6 wherein for control settings in the range of control settings less than said standard setting extending down to said further setting, the gain of each channel decreases as the setting decreases at a rate less than the decrease in gain as the control setting decreases for settings below about said further setting.

8. The apparatus according to claim 3 wherein for control settings in a range of control settings below about said further setting, the threshold remains substantially constant.

9. The apparatus according to claim 8 wherein for control settings in the range of control settings less than said standard setting extending down to said further setting, the gain of each channel decreases as the setting decreases at a rate less than the decrease in gain as the control setting decreases for settings below about said further setting.

10. The apparatus according to any one of claims 1-9 wherein for control settings at and above about said standard setting, substantially no compression is applied and the gain of the channels increases as the control setting increases.

11. The apparatus according to claim 1 wherein said standard acoustic level provides a standard acoustic level for dialogue and said threshold is above a loudness estimation level that results in the compression of dialogue, so that dialogue is not compressed.

12. The apparatus according to claim 1 wherein compression, when it is applied, is applied to all of the channels.

13. The apparatus according to claim 12 wherein compression, when it is applied, is applied uniformly to all of the channels.

14. The apparatus according to claim 12 wherein compression, when it is applied, is applied non-uniformly to the channels.

15. The apparatus according to claim 14 wherein the plurality of soundtrack channels includes a plurality of front soundtrack channels and a plurality of surround soundtrack channels, wherein less compression is applied to said surround soundtrack channels than to said front soundtrack channels.

16. The apparatus according to claim 1 wherein compression, when it is applied, is applied to some of the channels but not to all of the channels.

17. The apparatus according to claim 16 wherein compression, when it is applied, is applied uniformly to all of the channels to which compression is applied.

18. The apparatus according to claim 16 wherein compression, when it is applied, is applied non-uniformly to the channels to which compression is applied.

19. The apparatus according to claim 18 wherein the plurality of soundtrack channels includes a plurality of front soundtrack channels and a plurality of surround soundtrack channels, wherein less compression is applied to said surround soundtrack channels than to said front soundtrack channels.

20. The apparatus according to claim 1 wherein the compression applied to one or more channels has a linear limiting characteristic.

21. The apparatus according to claim 1 wherein the loudness estimated by the estimator is an estimation of the subjective loudness of the channels that would result if the control were set at its standard setting.

22. The apparatus according to claim 1 wherein the loudness estimated by the estimator is a measure of subjective loudness of the plurality of soundtracks as a function of an estimated acoustic level of some or all the reproduced channels, their frequency content, and time.

23. The apparatus according to claim 22 wherein the estimator provides a loudness estimation level in response to soundtrack channel signal voltage levels.

24. The apparatus according to claim 23 wherein the estimator provides a loudness estimation level in response to a summation of ~frequency-weighted and squared soundtrack channel signal voltage levels for all soundtrack channels.

25. The apparatus according to claim 24 wherein the frequency weighting is an A-weighting.

26. The apparatus according to claim 24 wherein the frequency weighting is a CCIR weighting.

27. The apparatus according to claim 1 wherein the estimator provides a loudness estimation level in response to metadata associated with the soundtrack channels.

* * * * *